United States Patent [19]
Carney et al.

[11] Patent Number: 5,943,215
[45] Date of Patent: Aug. 24, 1999

[54] PCI RISER CARD SUPPORT

[75] Inventors: James Carney, Pepperell; David Desilets, Hopkinton, both of Mass.; Clifford Willis, Tracy, Calif.

[73] Assignee: Sun Microsystems, Inc., Mountain View, Calif.

[21] Appl. No.: 08/880,302

[22] Filed: Jun. 24, 1997

[51] Int. Cl.⁶ .................................................. H05K 7/14
[52] U.S. Cl. ...................... 361/756; 361/683; 361/752; 361/784; 361/796; 439/62
[58] Field of Search .................................... 361/683, 684, 361/736, 740, 741, 748, 752, 756, 784, 785, 796; 439/160, 59, 61, 62

[56] References Cited

U.S. PATENT DOCUMENTS

| | | | |
|---|---|---|---|
| 5,338,214 | 8/1994 | Steffes et al. | 439/160 |
| 5,440,755 | 8/1995 | Harwer et al. | 395/800 |
| 5,513,329 | 4/1996 | Pecone | 361/684 X |
| 5,544,006 | 8/1996 | Radloff et al. | 361/683 |
| 5,555,158 | 9/1996 | Dent | 361/684 |

Primary Examiner—Leo P. Picard
Assistant Examiner—Jayprakash N. Gandhi
Attorney, Agent, or Firm—Julian Caplan; Flehr Hohbach Test; Albritton & Herbert LLP

[57] ABSTRACT

PCI cards are plugged into vertical risers, the lower edges of which have been plugged into a motherboard. This involves a considerable force being applied to the riser card, both during insertion and removal, and may damage the card or the underlying motherboard. A support for the top edge of the riser card clips onto the upper end thereof. Rearward extensions of the support are gripped by tabs struck out of a wall of the enclosure.

9 Claims, 1 Drawing Sheet

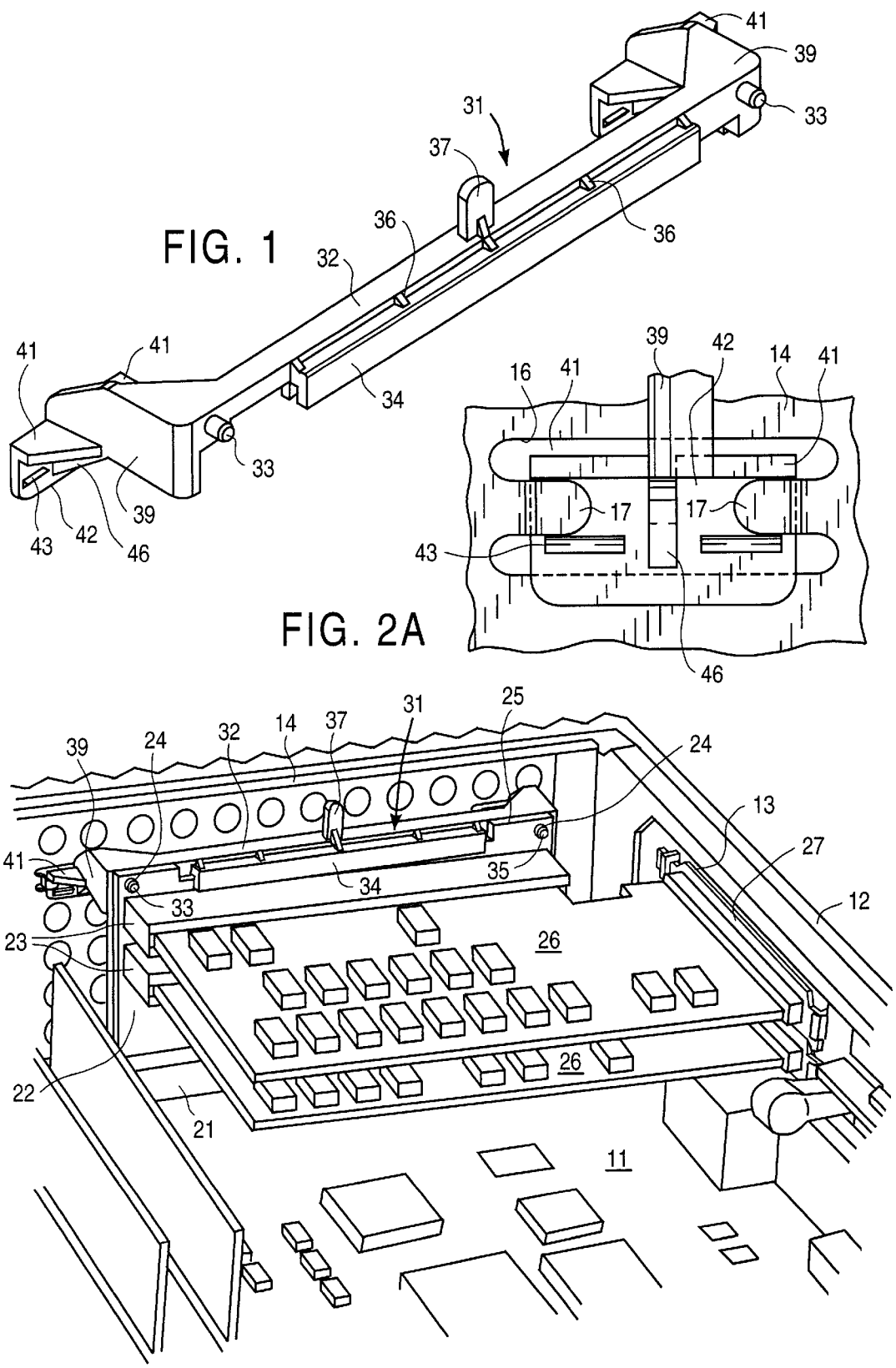

PCI RISER CARD SUPPORT

BACKGROUND OF THE INVENTION

1. Field of the Invention

This invention relates to a new and improved support for a riser card which projects upwardly from a computer motherboard. PCI cards are plugged into the upper end of the vertical riser. A support connects the upper edge of the riser to the casing of the computer enclosure to prevent possible damage to the riser when the PCI card is plugged into it.

2. Description of Related Art

The use of motherboards, riser cards and PCI cards is well known in the computer industry. The present invention differs from other cards in that it provides support for the riser card.

SUMMARY OF THE INVENTION

A support is snapped onto the upper edge of the riser card. Rearward extensions of the support are engaged by tabs, which are punched out of the sheet metal portion of the computer enclosure. The tabs grip a vertical end of a rearward extension of the support. In a preferred embodiment, pins extending from the support fit through holes in the riser, and a lip on the support fits over the upper edge of the riser.

BRIEF DESCRIPTION OF THE DRAWINGS

The accompanying drawings, which are incorporated in and form a part of this specification, illustrate embodiments of the invention and, together with the description serve to explain the principles of the invention.

FIG. 1 is a perspective view of a support in accordance with the present invention.

FIG. 2 is a schematic perspective view showing the support applied to the upper edge of a riser.

FIG. 2A is an enlarged fragmentary view showing tabs of the computer casing engaging a portion of the support.

DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Motherboard 11 is shown located near the bottom of a computer casing, which consists of a first side 12 having an opening 13 therein, and a back 14 also formed with a pair of openings 16 from which tabs 17 extend inwardly.

A socket 21 is located at a preselected position in the motherboard 11, and plugged into socket 21 is the lower edge of riser 22, which is similar to a small PCB. Riser 22 is provided with one or more transverse sockets 23 (here shown as two in number). Holes 24 are formed adjacent the upper corners of the riser 22, and the top edge 25 thereof is formed with a depression.

One or more PCI cards 26 are installed in the sockets 23. As illustrated herein, the sockets 23 slant downwardly, but it will be understood that this is a matter of design choice. PCI card 26 plugs into the socket 23 and has a side plate 27 which closes off opening 13.

Support 31 comprises a cross piece 32, having pins 33 extending forwardly near upper corners thereof, positioned and dimensioned to fit through holes 24 in riser 22. A downturned lip 34 of cross piece 32 engages the depressed upper edge 25 of riser 22. It will be understood that the support 31 may be applied to the riser 22 by inserting one of the pins 33 in one of the holes 24, and then pivoting cross piece 32 so that the opposite pin 33 snaps into the opposite hole 24, and the lip 34 snaps over the edge 25.

Lip 34 is reinforced by gussets 36. Extending upward from cross piece 32 is grip 37, which may be used in the attachment of support 31 to riser 22.

On either side of cross piece 32 are rearward extensions 39, which terminate at their rear ends in vertical end pieces 42. Wings 41 extend from extensions 39 to the outer edges of ends 42. A horizontal ridge 43 is formed in one surface of end 42.

As best shown in FIG. 2A, the vertical end 42 may be forced downwardly behind the tabs 17, which snap into place between ridges 43 and the undersides of wings 41. Thus, the support 31 is secured to the back 14 of the casing, and provides a support for the upper edge of riser 22, so that when cards 26 are plugged into the sockets 23, the card is not damaged.

It will further be understood that if it is necessary to remove the riser 22, the support 31 may be detached from the casing back 14 and likewise detached from the riser 22.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In combination, a computer casing having an end wall, said end wall having tabs, a motherboard perpendicular to said end wall, and a first socket on said motherboard, a riser card shaped to plug into said first socket and extending generally parallel to and spaced from said end wall, said riser card having an upper edge opposite said socket, said riser card having at least one second socket for a PCI card, a support comprising a crosspiece having a lip to snap over said upper edge, a pair of extensions on said crosspiece having vertical end pieces to engage said tabs to support said crosspiece solely from said end wall, said crosspiece supporting said upper edge of said riser card.

2. The combination of claim 1 in which said riser card is formed with an aperture and said crosspiece has a pin to fit in said aperture.

3. The combination of claim 1 in which each said extension extends toward said end wall and has a downward stretch on the end of said extension opposite said crosspiece.

4. The combination of claim 3 in which said end wall is formed with offset tabs and each said downward stretch is engaged by one said tab.

5. The combination of claim 4 in which each said downward stretch is formed with a ridge located to confine said tab along said downward stretch below said extension and above said ridge.

6. The combination of claim 5 in which said extension has a horizontal wing above said downward stretch and said tab is between said wing and said ridge.

7. The combination of claim 2 in which said riser card is formed with a second aperture opposite said first mentioned aperture, said crosspiece having a second pin to fit in said second aperture, said pins being outward of ends of said lip.

8. The combination of claim 7 in which said crosspiece engages a first face of said riser card and said lip engages a second face of said riser card opposite said first face and also said upper edge of said riser card.

9. The combination of claim 8 in which said upper edge is formed with a depression into which said lip fits.

* * * * *